United States Patent
Rkc Saraswatula et al.

(10) Patent No.: US 11,017,822 B1
(45) Date of Patent: May 25, 2021

(54) YIELD-CENTRIC POWER GATED REGULATED SUPPLY DESIGN WITH PROGRAMMABLE LEAKERS

(71) Applicant: XILINX, INC., San Jose, CA (US)

(72) Inventors: Sree Rkc Saraswatula, Hyderabad (IN); Narendra Kumar Pulipati, Hyderabad (IN); Santosh Yachareni, Hyderabad (IN); Shidong Zhou, Milpitas, CA (US); Sundeep Ram Gopal Agarwal, Hyderabad (IN); Brian Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/672,089

(22) Filed: Nov. 1, 2019

(51) Int. Cl.
G11C 5/14 (2006.01)
G11C 29/50 (2006.01)
H01L 25/065 (2006.01)

(52) U.S. Cl.
CPC .............. *G11C 5/148* (2013.01); *G11C 29/50* (2013.01); *H01L 25/0657* (2013.01); *H01L 2225/06541* (2013.01)

(58) Field of Classification Search
CPC ..... G11C 5/148; G11C 29/50; H01L 25/0657; H01L 2225/06541
USPC ........................................................ 365/226
See application file for complete search history.

(56) References Cited

U.S. PATENT DOCUMENTS

| | | | | |
|---|---|---|---|---|
| 7,609,561 B2* | 10/2009 | Cornwell | ............... | G11C 29/88 365/185.09 |
| 8,446,772 B2* | 5/2013 | Tu | .......................... | G11C 29/832 365/185.18 |
| 9,432,298 B1* | 8/2016 | Smith | ................. | H04L 49/9057 |

* cited by examiner

*Primary Examiner* — Tha-O H Bui
(74) *Attorney, Agent, or Firm* — Patterson + Sheridan, LLP

(57) ABSTRACT

Examples described herein provide a method for disabling a defective portion of a fabric die of a stacked IC device. The method includes receiving a signal indicating that a portion of a fabric die of a stacked IC device including at least two fabric dies is defective. The method further includes, in response to the signal, pulling a source voltage rail of the defective portion to ground, thereby disabling the portion, and operating the remainder of the fabric die without interference from or contention with the disabled portion. In one example, the stacked IC device is an active on active (AoA) device, and the portion of the fabric die includes a configuration memory cell. In one example, the signal is received after power-up of the stacked IC device.

20 Claims, 7 Drawing Sheets

| PL Power-up seq | por int b | dis vgg pd | en defective** | ed defective vgg | vgg | vgg rail |
|---|---|---|---|---|---|---|
| Stage0-5 | 0 | 0 | 0 | 0 | 0 | 0 |
| Stage6 | 0 | 1 | 0 | 0 | ramp-up | vgg |
| Stage9 | 1 | 1 | 0 | 0 | vgg | vgg |
| Functional (Non-Defective) | 1 | 1 | 0 | 0 | vgg | vgg |
| Functional (Defective) | 1 | 1 | 1 | vgg | vgg | 0 |

FIG. 2

YIELD-CENTRIC POWER GATED REGULATED SUPPLY DESIGN WITH PROGRAMMABLE LEAKERS

TECHNICAL FIELD

Examples of the present disclosure generally relate to stacked integrated circuits (ICs), and in particular to yield-centric power gated regulated supply design for active-on-active (AoA) stacked integrated circuits (ICs).

BACKGROUND

AoA stacked ICs have a significantly higher device density than monolithic designs. For example, an AoA device may have an IO die on which may be provided four fabric dies stacked above it. The AoA device is often constructed prior to determining which parts of any of its constituent fabric dies are defective. In some cases, a fabric die of the device may be defective, in whole or in part. In other cases there may be different portions or regions of multiple fabric dies of the device that are defective. When this occurs, the portions of each fabric die that are defective need to be powered down so as to draw low power, and reduce current leakage.

SUMMARY

In one example, a method includes receiving a signal indicating that a portion of a fabric die of a stacked IC device including at least two fabric dies is defective, and in response to the signal, pulling a source voltage rail of the defective portion to ground, thereby disabling the portion. The method further includes operating the remainder of the fabric die without interference from or contention with the disabled portion.

In one example, the signal is received after power-up of the stacked IC device, and the stacked IC device is an active on active (AoA) device.

In one example the method further includes determining, following pulling the source voltage rail of the defective portion to ground, whether the disabling of the defective portion has decreased stability by a predefined metric. In such example, the method further includes, in response to the determination, operating a leaker circuit of a source voltage grid of the stacked IC device corresponding to the two-dimensional location of the defective portion.

In another example, an apparatus for power regulation includes an input interface, configured to receive a signal indicating whether a portion of a fabric die of a stacked IC device is defective, an output interface, configured to output a regulated supply voltage (Vgg) to a voltage rail (Vgg rail) of the portion of the fabric die; and processing circuitry, coupled to the input interface and to the output interface, configured to, in response to the signal indicating that the portion of the fabric die is defective, output, via the output interface, a ground voltage to the supply voltage rail.

In still another example, a stacked IC device includes an IO die, at least two fabric dies provided above the IO die, and a plurality of vertical conduits, each conduit extending from the IO die to each of the fabric dies and supplying a voltage Vgg to an adjacent region of each fabric die. Additionally, at each fabric die, at least one power switch is coupled to each conduit and to the adjacent region of the fabric die, and each power switch includes an input interface, configured to receive a signal indicating whether the adjacent portion of the fabric die is defective or functional, an output interface, configured to output a regulated supply voltage to a voltage rail (Vgg rail) of the adjacent portion, and processing circuitry, coupled to the input interface and to the output interface, configured to, in response to the signal indicating that the adjacent portion is defective, output, via the output interface, a ground voltage to the voltage rail.

BRIEF DESCRIPTION OF DRAWINGS

So that the manner in which the above recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope.

FIG. 2 is a chart of example signal values for the power switch of FIG. 1, according to some examples.

Figure 1:
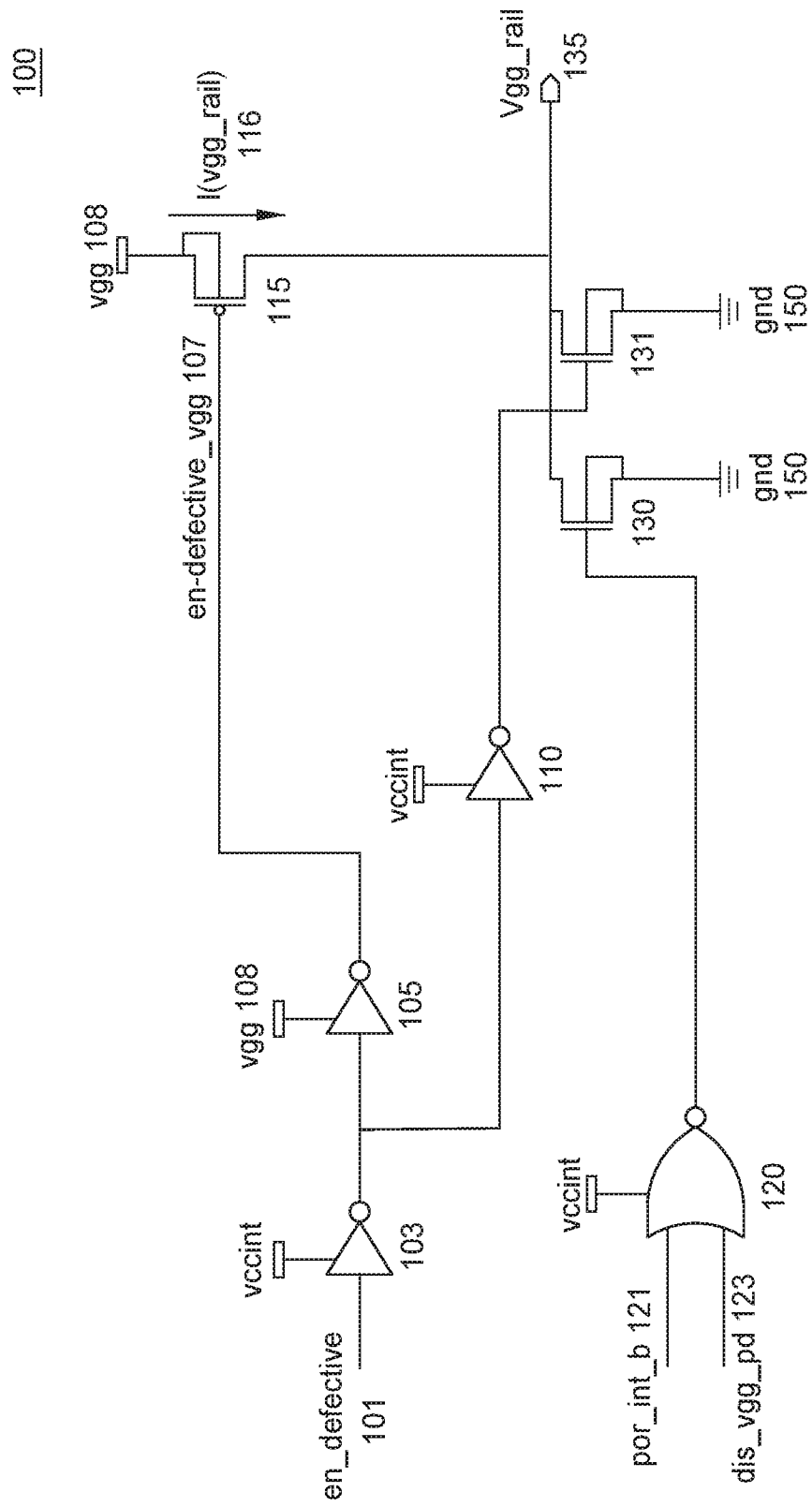
FIG. 1 is a power switch, configured to pull Vgg_rail down to ground on defective dies after power-up, according to some examples.

These and other aspects may be understood with reference to the following detailed description. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example does not need to have all the aspects or advantages shown. An aspect or an advantage described in conjunction with a particular example is not necessarily limited to that example and can be practiced in any other examples even if not so illustrated, or if not so explicitly described.

Examples described herein generally relate to an AoA stacked IC device including one or more defective portions. In one example, an AoA device includes an IO die, and provided on top of the IO die are several fabric dies. In some examples there may be four fabric dies provided on top of the IO die. In some examples, a plurality of vertical conduits, each conduit extending from the IO die to each of the fabric dies, supplies a regulated voltage Vgg to an adjacent region of each fabric die. In some examples, a portion of one of the fabric dies of the stacked IC device may be defective. In other examples, multiple portions of a single fabric die, or one or more portions of several fabric dies, or even one or more entire fabric dies, may be defective.

In one example, the portions of fabric dies that are defective are determined at or subsequent to manufacture, and encoded in e-fuses on the stacked IC device provided in the IO die. In some examples, a power switch is provided at regular intervals on each fabric de, in both dimensions (a fabric die may be understood as being a horizontal layer of circuitry, and thus the fabric die having two dimensions). In some examples, the power switches thus provide a regulated supply voltage to an adjacent portion of each fabric die of the stacked IC device. In such examples, the power switch is configured to operate in two modes. In a normal operational mode, when the portion of the fabric die that the power switch supplies is functional, the power switch outputs a supply voltage Vgg to the adjacent portion.

When the stacked IC device is powered on, a defective signal is generated from the e-fuses and sent to the power switch provided at each defective portion of each fabric die of the stacked IC device. Upon receipt of the defective signal, the switch operates in a defective operational mode, and each such power switch pulls the supply voltage rail Vgg_rail down to ground, thereby isolating the defective portion.

Moreover, in examples, in addition to a power switch to regulate respective portions of each fabric die, in the IO die of the stacked IC device there are provided leaker cells. These are respectively coupled to each vertical conduit of the Vgg grid, and are programmable to bleed off a certain amount of current to replicate memory cell leakage for defective dice whose power is supplied by that conduit.

Aspects of these and other examples are described below. Various modes can be implemented using examples described herein, which can permit flexibility for use of programmable logic. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a power switch 100, configured to isolate actual Vgg from Vgg_rail and pull Vgg-rail down to ground on a defective portion of a die, in response to a signal indicating that the portion is defective following power-up, according to some examples. Additionally, as described below, the switch of FIG. 1 also pulls Vgg_rail down to ground if certain power related signals remain low at the end of an initial power-up sequence. In some examples, a power switch such as that of FIG. 1 is provided in each of multiple portions of each fabric die of a stacked IC device, and is used to disable any portion of the die that is defective. In some examples, by providing power switch 100 in each portion or region of each fabric die of a stacked IC device as a matter of course, by having that power switch control supply voltage to a certain pre-defined number of circuits, e.g., memory cells, of the fabric die, and by providing a signal to each such power switch that indicates whether or not that region of the fabric die is defective, a built-in solution is implemented to handle any defective region. Moreover, in such examples, it is not necessary to know in advance which region of a fabric die served by a given power switch is defective. Each region has a power switch, and those that need to be turned off are sent the appropriate signal at power up.

Continuing with reference to FIG. 1, there is shown at the top left of power switch 100 an "en_defective" signal 101, which is input to inverter 103. Inverter 103 is connected to supply voltage vccint. In some examples, en_defective signal 101 is generated in the IO die of the stacked IC device, by logic that receives as inputs the data regarding defective regions of fabric dies that is encoded in the e-fuses.

Continuing with reference to FIG. 1, the output of inverter 103 is input to both second inverters 105 and 110, respectively. As shown, second inverter 105 is connected to regulated supply voltage Vgg 108. This facilitates level shifting of the en_defective signal 101 from vccint (with which inverter 103 is supplied) to the vgg domain to drive PMOS transistor 115, which has a vgg supply. It is here noted that, in some examples, the maximum voltage of vgg may be slightly higher than 1V, such as, for example, 1.051V, whereas the minimum voltage of vccint may be, for example, 0.675V. It is noted that, in the depicted example, with reference to inverter 103 and NOR gate 120, all of the pull down control signals that drive NMOS transistors 130 and 131, namely en_defective, por_int_b and dis_vgg_pd, are in the vccint domain. Thus, vccint is sufficient to pull down vgg_rail 135, as the pull up path (PMOS transistor 115) is simultaneously "OFF."

In some examples, regulated supply voltage Vgg is generated in the IO die, as described in detail below with reference to FIGS. 3A and 4. In the depicted example of FIG. 1, the output of second inverter 105, as noted, connected to regulated supply voltage Vgg 108, is input to PMOS transistor 115, which is also connected to regulated supply voltage Vgg 108. As shown, the output of inverter 105 is a signal "en_defective_vgg" 107.

In some examples, en_defective signal 101 is low, or a digital 0, when the portion of the fabric die in which power switch 100 is provided is non-defective, and is high, when that portion of the fabric die is defective. Thus, in such examples, for a defective portion of the fabric die, en_defective 101 is 1 and en_defective_vgg 107 is Vgg. The reason that Vgg is used here instead of "1" is because, as noted above, in the example of FIG. 1, Vgg may have a maximum value of 1.051V and vccint may have a minimum value of 0.675V. Thus, en_defective signal is level shifted from the "vccint" domain to that of "Vgg", whose voltage is equivalent to a digital "1", but in the Vgg domain. This is done in order to completely turn off PMOS transistor 115 in response to the high en_defective signal.

As a result, when PMOS transistor 115 does not turn on (as it requires an input voltage of zero or less to turn on), I(Vgg-rail) 116 does not flow, and Vgg 108 is not passed through PMOS transistor 115 to Vgg_rail 135. Moreover, because in the case of a defective die en_defective 101 is 1, Vgg_rail 135 is pulled down to ground 150 by NMOS transistor 131, as next described.

Continuing with reference to the bottom left of FIG. 1, NOR gate 120 takes as inputs two power signals por_int_b 121 and dis_vgg_pd 123 that are normally high at the end of an initial power-up sequence, as described below. Thus, at that point, when both of these signals, por_int_b 121 and dis_vgg_pd 123, are high, the output of NOR gate 120 is 0. In some examples, dis_vgg_pd 121 and por_int_b 123 signals are generally high at the end of an initial power-up sequence. However, they may both be low after such an initial power-up sequence of the chip when one of the platform layer ("PL") fabric supplies (e.g., vccint, vccaux or vcc_ram), or one of the platform management controller ("PMC") supplies (e.g., vccint, pmc, or vccaux_pmc) is not operative.

Continuing further with reference to FIG. 1, the output of NOR gate 120 is input to a first NMOS transistor 130, whose drain is connected to Vgg_rail 135. NMOS 130 pulls down Vgg_rail 135 any time both of the inputs to NOR 120 are zero, and thus the output of NOR 120 is a "1" which turns on NMOS 130.

Because NMOS transistor 130, which requires a positive gate voltage to turn on, is not turned on after a normal power-up sequence, where first dis_vgg_pd goes high, and then por_int_b goes high, at the end of a power-up sequence, Vgg_rail 135 is not pulled to ground at NMOS 130. In this case the value of Vgg_rail 135, which is the ultimate output of power switch 100, is determined by the state of second NMOS transistor 131. Second NMOS transistor 131 is normally off, given that its gate is tied to the output of second inverter 110, which is generally at a low voltage, or 0, when in normal operation, and thus when en_defective 101 is 0, indicating that the region of a fabric die in which power switch 100 is provided is functional. However, if en_defective 101 is 1, indicating that the region of the fabric die in which power switch 100 is provided is non-functional, and the region thus must be disabled, NMOS 131 is then turned on, and Vgg_rail 135, to which the drain of NMOS 131 is connected, is pulled down to the ground voltage 150 which the source of NMOS 131 is connected to, as shown.

Thus, if the value of en_defective is 1, Vgg_rail 135 will be pulled down to ground 150, and any circuitry supplied by Vgg_rail 135 will be therefore disabled.

Moreover, in one example, in all cases after power-up and independent of any defective fabric region a Vgg generated on the IO die will always be high and at the specified value which is dependent on the temperature. Vgg_rail is then connected as a supply to various configuration memory cells (MCs) at respective fabric interconnect, configurable logic element (CLE) and interface columns. Vccint is the core voltage for the fabric blocks, e.g., interconnect, CLE and interface. Having Vgg as a supply to the configuration MCs helps to speed up the interconnect's performance, because Vgg is designed to be a temperature dependent higher voltage than vccint. Thus, in a non-defective region of a die vgg=vgg_rail, and for a defective region vgg_rail=0. In such examples, in similar fashion vccint will also be power gated in defective regions of the fabric dies.

FIG. 2 is a table of six example signal values relating to the power switch of FIG. 1. The six relevant signals are listed in the columns of the table of FIG. 2. For ease of comparison, the index number of a column of the table of FIG. 2 has the same tens and units digits as does the corresponding signal shown in FIG. 1. Thus, for example, the signal "en_defective" 101 of FIG. 1 is listed in FIG. 2 in column 201. As noted above with reference to FIG. 1, in the example power switch of FIGS. 1 and 2, for a functional portion of a fabric die the signal en_defective is given the value 0, and for a non-functional portion of a die, the en_defective signal is given a value of 1. With reference to FIG. 2, this is shown in column 201 at rows 210 and 211, respectively.

It is noted with respect to FIG. 2 that the top three rows refer to stages in an example power-up sequence, and the bottom two rows refer to the values of the six variables for each of the functional die and non-functional (defective) die cases, respectively, after power-up. Continuing with reference to FIG. 2, columns 221 and 222 show the values por_int_b and dis_vgg_pd, respectively. As noted above, in the example of FIG. 1, these signals are normally high at the end of the power-up sequence, as shown in the row entitled "Stage9", and are input to the NOR gate 120 of FIG. 1. In the depicted example, por_int_b is the equivalent of another signal used in this example, por_b. Por_int_b is delayed from por_b by several microseconds to avoid contention with other interconnect memory cells. Por_b is an inverted version of a global power on reset signal that indicates that all power supplies are ready to perform any operation on the chip. In the same depicted example, dis_vgg_pd is a disabling signal that indicates that vgg should be disabled by pulling it down to ground. It is noted that in the depicted example, the dis_vgg_pd signal disables vgg when dis_vgg_pd=LOW. This occurs through an early stage of an initial power-up sequence. However, at a later stage in the power-up sequence, dis_vgg_pd goes HIGH, and thus there is no Vgg pull down. In the example of FIG. 2, as shown at column 222, the dis_vgg_pd signal is LOW at stages 0-5, but from stage 6 onwards, it is HIGH, and thus does not cause any Vgg pull down. In other examples, dis_vgg_pd may go HIGH at an even earlier stage, at which time it ceases to cause any Vgg pull down.

Finally, column 235 illustrates values for the output of the power circuit, namely Vgg_rail. As shown in row 210, Vgg_rail has the value "vgg" for a functional region of the fabric die, which is a normal voltage supply value, and as shown in row 211, Vgg_rail has the value 0 for a defective region of the fabric die. Thus, in such examples, the power switches pass Vgg regulated supply voltage to functional regions, and pass ground voltage to defective regions.

Figure 3A:
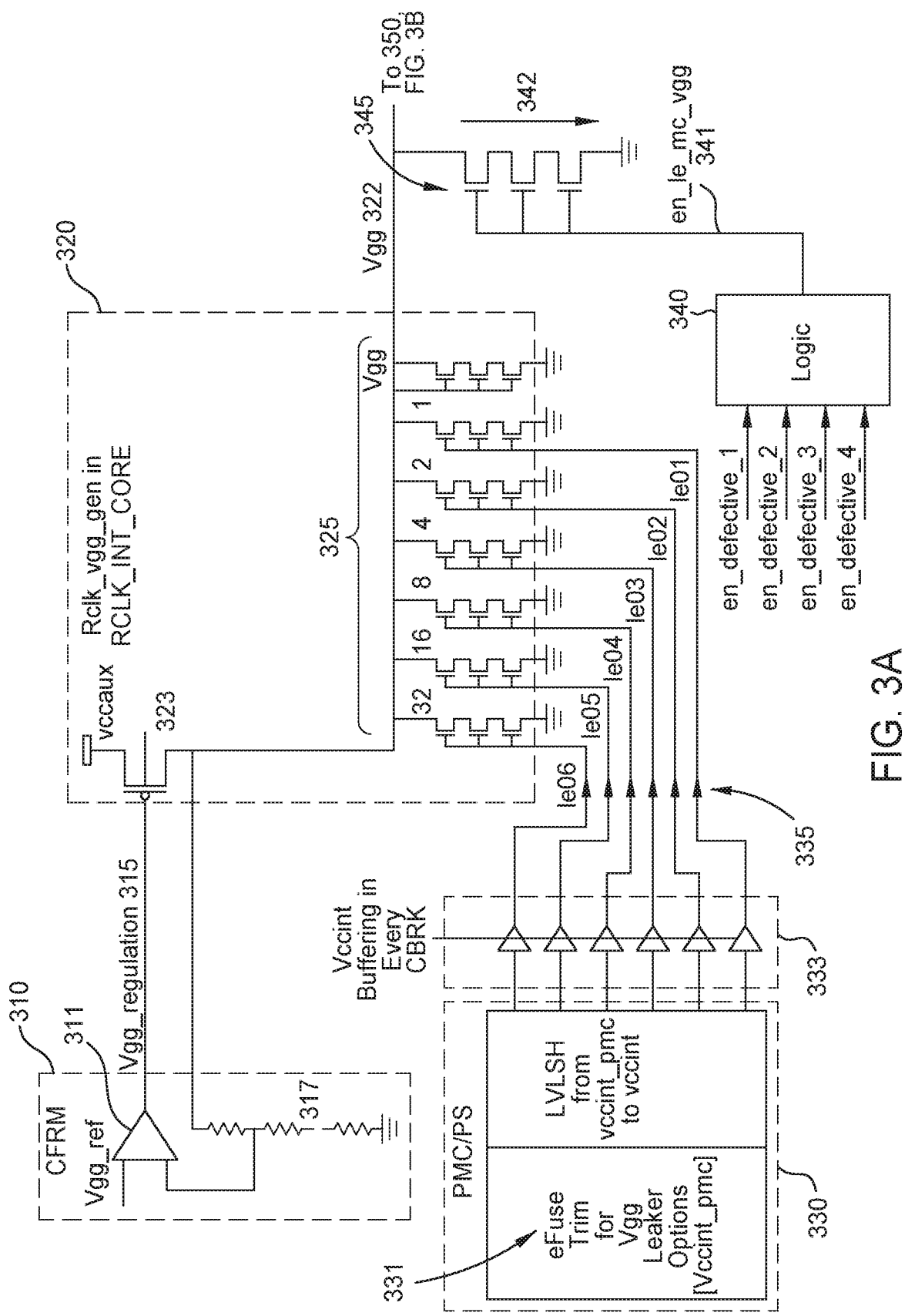
FIG. 3A is a first portion of a Vgg generation circuit for AoA devices, according to some examples.
Figure 3B:
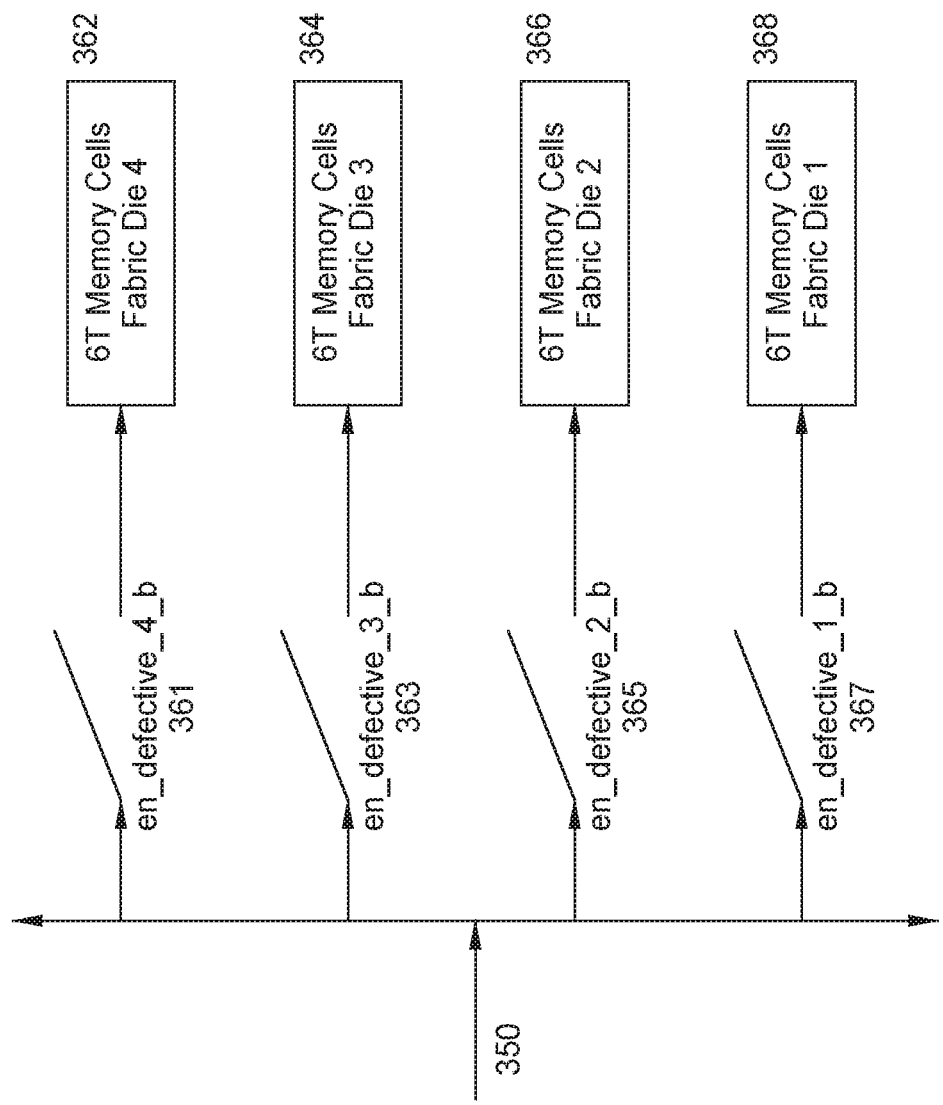
FIG. 3B is a second portion of the Vgg generation circuit of FIG. 3A, according to some examples.

FIGS. 3A and 3B together illustrate an example Vgg generation circuit for AoA devices, according to some examples. FIG. 3A is a first portion of the circuit, and FIG. 3B shows a second part of the circuit. In one example, as shown in FIGS. 3A and 4, the Vgg generation circuits are all provided in the IO die at regular intervals. It is from the Vgg generation circuits that the vertical conduits, such as, for example, 410 and 403 in FIG. 4, extend upwards, providing supply voltage to each portion or block of each fabric die.

With reference to FIG. 3A, in the disclosed example, the Vgg generation circuit includes the following sub-circuits: column frame (CFRM) 310, platform management controller/processor sub-system (PMC/PS) 330, and a set of buffering inverters 333. These are next described. CFRM 310 is a controller that performs memory cell configuration. It also reads back and distributes global signals across the chip. PMC/PS 330 has several sub-modules. It is used to boot and configure the chips. Finally, the buffering inverters 333 are used to maintain the voltage driving capability of pull-down control signals all over from PMC/PS to the RCLK region (referred to in Vgg generation circuit 320). The signals 335 that are output from buffering inverters 333, shown as signals le01 through le06, in some examples, are input to leaker circuits 325, which include sets of NMOS transistors, as shown, within Vgg generation circuit 320. The load on Vgg, e.g., the number of memory cells, varies from one device to another in a product family. Thus, leaker circuits 325, which include sets of NMOS transistors in series, provide a leaker current that consumes extra current through vccaux to make a negative feedback loop stable for different memory cell loads for different chips in a product family. In examples, this negative feedback loop comprises:

vgg_ref in 310→vgg_regulation 315→feedback from drain of PMOS 323→resistor divider 317→other (bottom) input of operational amplifier 311.

In some examples, Vgg generation circuit 320 uses PMOS transistor 323 to output Vgg 322, which is then input to each region of each fabric die of the stacked IC device through the Vgg grid. Vgg 322 is thus input to signal line 350 of FIG. 3B, described below.

As noted above, at the output of Vgg generation circuit is voltage supply output Vgg 322. In one example, as shown in FIG. 3A, Vgg supply output 322 is also connected to a series of pull down NMOS transistors that schematically represent example leaker circuits 325. Moreover, a generic leaker 345 is shown at the bottom right of FIG. 3A, as connected to logic 340, to illustrate the operation of the pull down NMOS transistors. Thus, as shown, the gates of leaker circuit 345 are connected to the output of logic 340, which processes the defective signal inputs en_defective_1 through en_defective_4, which are generated (by circuitry not shown) from the information encoded in e-fuses 331, as shown at the left side of PMC/PS 330 at the bottom left of FIG. 3A.

Thus, in the example of FIG. 3A, the inputs en_defective_1 through en_defective_4 represent a defective die region signal in each of four fabric dies which comprise the example stacked IC device. Logic 340 processes the en_defecitve input signals and outputs a signal "en_le_mc_vgg" 341. This signal, which stands for "enable leaker memory cell vgg" enables leaker circuit 345 (which is representative of leaker circuits 325) to draw an additional current 342 from the vgg supply line at a designated XY region of one or more given fabric dies, to replicate memory cell (MC) leakage when one or more defective regions of one or more dies adjacent to a given Vgg vertical supply conduit is or are disabled. In some examples, the leaker circuits 325, 345 turn on one or more NMOS transistors to pull additional current from a Vgg supply conduit serving the defective region of a given die.

It is noted that in some examples a fixed leaker setting is desired for all devices in a family, so that a generic setting may be applied from a minimum load to a maximum load. However, notwithstanding the generic setting, if oscillations are seen due to circuit bandwidth limitations for a specific device, there is an option, as illustrated in FIG. 3A, to bleed more current, in various amounts, such as, for example, 1×, 2×, 4×, . . . 32×, as shown by leaker circuits 325. Thus, the amount of current drawn is dependent upon the number of MCs load (both current load and capacitive load) contribution by that defective region. Thus, in some examples, a leaker circuit uses additional current, not needed by the now disabled defective die, in order to obtain greater stability. Just like the case of power switch 100 of FIG. 1, leaker circuits are specific to each region of the fabric die.

FIG. 3B is a second portion of the circuitry shown in FIG. 3A, according to some examples. FIG. 3B schematically illustrates using multiple power switches 361 through 367 at each of corresponding fabric dies 362 through 368 to disable any defective fabric die or region thereof. These power switches, in some examples, are equivalent to power switch 100 of FIG. 1. Thus, at each fabric die of the stacked IC device, there may be a plurality of configuration memory cells. These are represented by memory cells provided on each of fabric dies 362 through 368 of FIG. 3B. In one example, each fabric die includes 6T memory cells. In some examples, these memory cells are each provided with a supply voltage Vgg, provided by a Vgg grid that permeates the entire stacked IC device. The Vgg grid includes several vertical Vgg conduits that extend from the IO die at the bottom layer of the stacked IC device, and that extend upwards through all of the various fabric die layers of the stacked IC device. In such examples, a power switch regulates whether or not a given region of memory cells, is supplied with Vgg, or whether it is effectively turned off, by supplying the memory cell with a ground voltage, or 0. In this way the power switch is the voltage and power gateway to its adjacent memory cell. In other examples, the region may contain other circuitry than memory cells, or a combination of memory cells and other circuitry.

Figure 4:
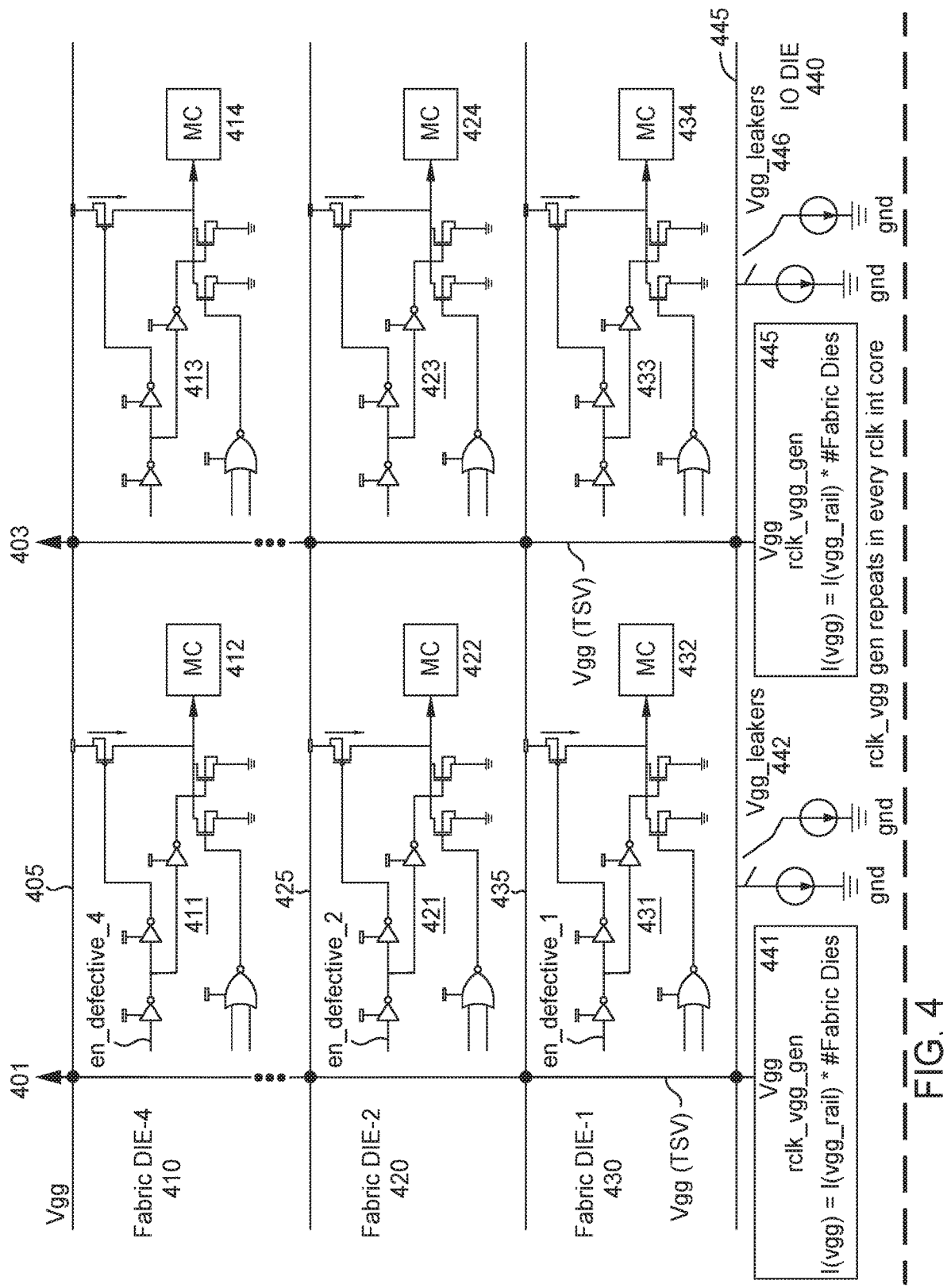
FIG. 4 is a diagram showing a Vgg generation circuit and a Vgg grid extending from an IO die to the various fabric layers of an AoA, including the power switch of FIG. 1 respectively provided between a Vgg_rail and each adjacent configuration 6T memory cell (MC), according to some examples.

FIG. 4 shows a schematic diagram of a 2D slice of a 3D AoA device, according to some examples. With reference to FIG. 4, there is a set of Vgg generation circuits 441, 445 provided in an IO die of an AoA device according to such examples. As shown, from each Vgg generation circuit, namely 441 and 445, a vertical vgg rail 401, 403 is provided that passes upwards to the fabric dies above by means of a through silicon via (TSV), as indicated. The Vgg rails provide power to the circuitry on the various fabric dies. Additionally, at each fabric die, namely 410, 420 and 430, there is a horizontal conduit to which all of the vertical Vgg rails are connected. In this manner a Vgg grid comprising the vertical Vgg rails, e.g., 401 and 403, and horizontal Vgg conduits 405 in fabric die-4 410, 425 in fabric die-2 420, 435 in fabric die-3 430 and 445 within the IO die, respectively, is provided throughout the entire example stacked IC device of FIG. 4.

In one example, adjacent to each Vgg generation circuit in IO die 440 (shown at the bottom of FIG. 4), is further provided a Vgg leaker circuit. Thus, at Vgg generation circuit 441 there is an adjacent Vgg leaker circuit 442, and similarly, at Vgg generation circuit 445 there is an adjacent Vgg leaker circuit 446. As noted above, in one example the Vgg leakers 442, 445 are programmed to draw additional current to replicate memory cell (MC) leakage when a given defective die on which a MC is provided is disabled. In some examples, the leaker circuits are appropriately programmed to improve stability. Each leaker has a specific current drawing capability. For example, le01 provides 1× current drawing capability; where as le02→2×; le03→4×; le04→8×; le05→16× & le06→32× respectively. In a way, we are programming the current through leakers in a binary way.

Figure 5:
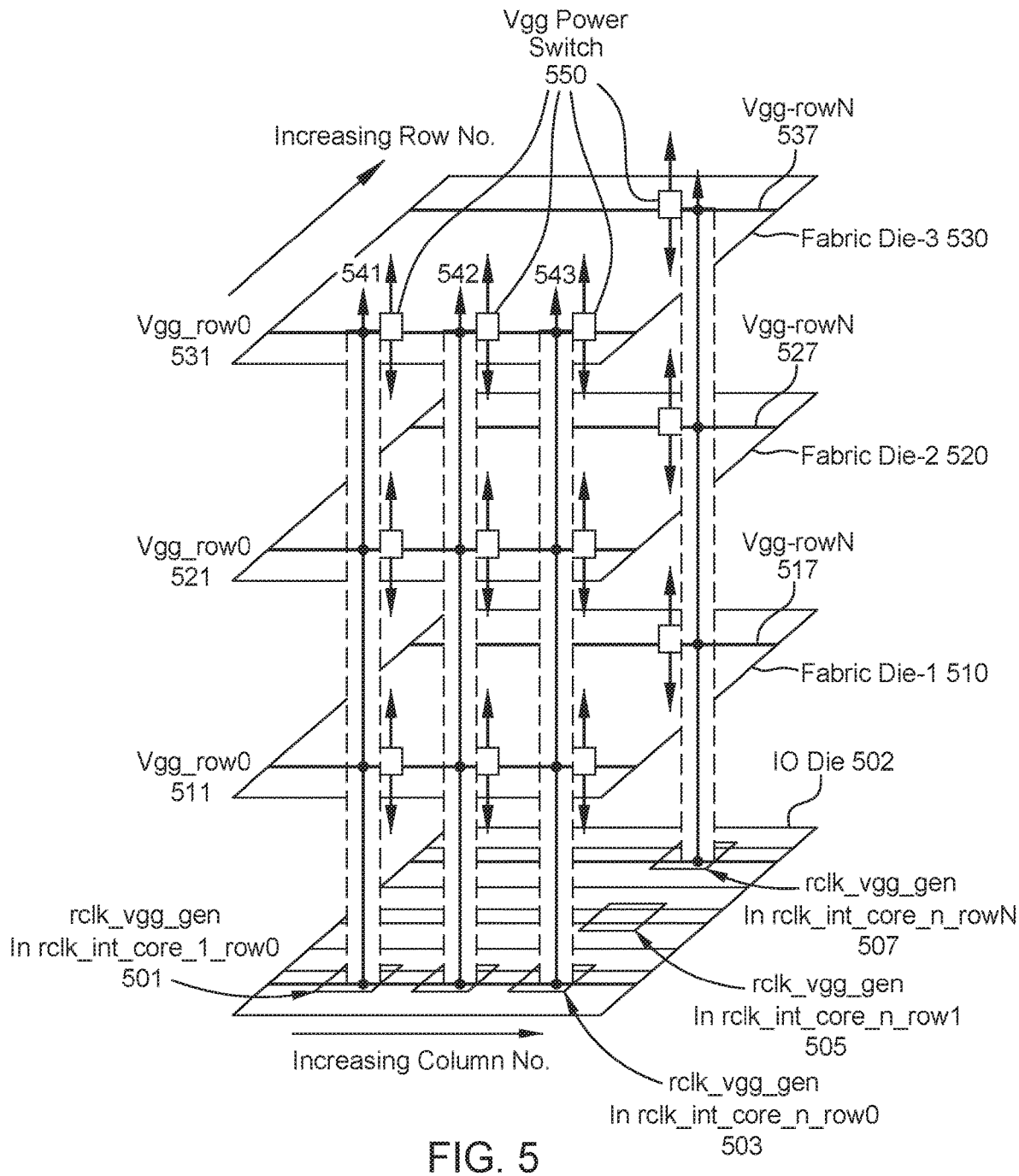
FIG. 5 is a 3D illustration of an AoA device, the device provided with multiple power switches on each fabric die, according to some examples.

Continuing with reference to FIG. 4, at each fabric die there are several individual regions, and each region is provided with a power switch that regulates power to a MC provided at that region of the fabric die. These power switches 411, 413, 421, 423, 431 and 433 each output Vgg_rail, in similar fashion to the power switch of FIG. 1. For example, at fabric die-4 410, there are shown two example regions, when viewing from left to right in FIG. 4. At the first, or leftmost, region is provided power switch 411, which regulates power to MC 412. Power switch 411 draws power from horizontal rail 405 to which it is connected. This connection is analogous to the connections to Vgg at inverter 105 and at PMOS transistor 115 in FIG. 1. Similarly, in the rightmost portion of fabric die-4 410, there is provided power switch 413 which regulates power to MC 414. As noted, each of the power switches 411 and 413 are connected to supply voltage Vgg, from the Vgg grid, which includes the vertical rails 401 and 403 (and others not here shown) that move up through the various fabric die layers, as well as horizontal Vgg rail 405, and each output Vgg_rail to their respective MC block. The power switches of fabric die-2 420, namely 421 and 424 respectively supply power (Vgg_rail) to MCs 422 and 424, and are connected to Vgg conduit 425, and similarly, the power switches 431 and 433 of fabric die-1 430 respectively supply power (Vgg_rail) to MCs 432 and 442, and are connected to Vgg conduit 435. Each power switch, in each region of each fabric die receives a defectivity signal "en_defective_N", where N is the die number, and may turn off power to the adjacent circuitry if that signal is high. As noted above, FIG. 4 is a single 2D slice of a larger 3D stacked IC device. FIG. 5 is a 3D perspective view of such an example 3D stacked IC device, and includes multiple rows, each row having multiple columns. FIG. 5 is next described.

FIG. 5 is a 3D illustration of an AoA device, the device provided with multiple power switches on each of three fabric dies, according to some examples. The fabric dies Fabric Die-1 510, Fabric Die-2 520 and Fabric Die-4 540 are provided above a bottom layer IO Die 502. As shown in FIG. 5, there are several rows of 2D Vgg grids, being rows Vgg_row0 through Vgg_row_N, as shown. A row in this context is a vertical planar region crossing through each of the horizontal planar 10 and fabric dies, respectively. Each row of rows Vgg_row0 through Vgg_row_N in FIG. 5 is equivalent to the single row illustrated in FIG. 4. In such examples, each row of rows Vgg_row0 through Vgg_row_N in FIG. 5 intersects with multiple columns, each such column being a vertical planar region that is perpendicular to both the row planes (which are parallel to the plane of the page) and the horizontal planes of the dies. Thus, within a row plane, the intersection with each columnar plane is a single vertical Vgg rail, as shown. For example, in Vgg_row0 there are three vertical Vgg conduits 541, 542 and 543, which, as shown in FIG. 4, pass upwards through each fabric die via a TSV. Additionally, at the level of each fabric die of the example AoA device, within each row, there is a horizontal conduit connecting the various Vgg columnar conduits. For example, in the first row, row Vgg_row0, the horizontal Vgg conduit 511 is provided on Fabric Die-1 510, the horizontal Vgg conduit 521 is provided on Fabric Die-2 520, and the horizontal Vgg conduit 531 is provided on Fabric Die-1 530. Each of these horizontal grid lines intersect vertical Vgg grid lines 541, 542 and 543, as shown. Similarly, at the rear of FIG. 5, there is shown row Vgg_row_N, with horizontal Vgg conduit 517 provided on Fabric Die-1 510, horizontal Vgg conduit 527 is provided on Fabric Die-2 520, and horizontal Vgg conduit 537 is provided on Fabric Die-1 530, as shown.

Continuing with reference to FIG. 5, at each region of each fabric die, the region designated on that die by row and column, is provided a Vgg power switch 550, which may be the same as power switch 100 of FIG. 1. The Vgg power switches 550 are connected to the horizontal Vgg rails, as described above with reference to FIG. 4, and disable their respective regions in response to a high "en_defective" signal as described in detail above. The Vgg power switches 550 disable their respective regions by pulling the Vgg_rail output by a given Vgg power switch 550, to a given defective region as designated by a specific column and row, down to ground. Power switches serve as a gate for power to pass from the Vgg grid to circuitry (and thus there is a set of two arrows, one pointing up and another pointing down, at each power switch).

It is noted that, in examples, such as those illustrated in FIGS. 4 and 5, by providing all Vgg generation circuits and leaker circuits in the IO die, power MOSFETs and other thick-ox designs at the vccaux level (HV, typically 1.5 v+/−10%) are placed on the common IO Die. Then, in such examples, only a thin-ox power switch, such as power switch 100 of FIG. 1, or power switches 411, 413, 421, 423, 431 and 433, all as shown in FIG. 4, and multiplexers are placed in the fabric dice. This results in significant area savings on the various fabric dies.

Figure 6:
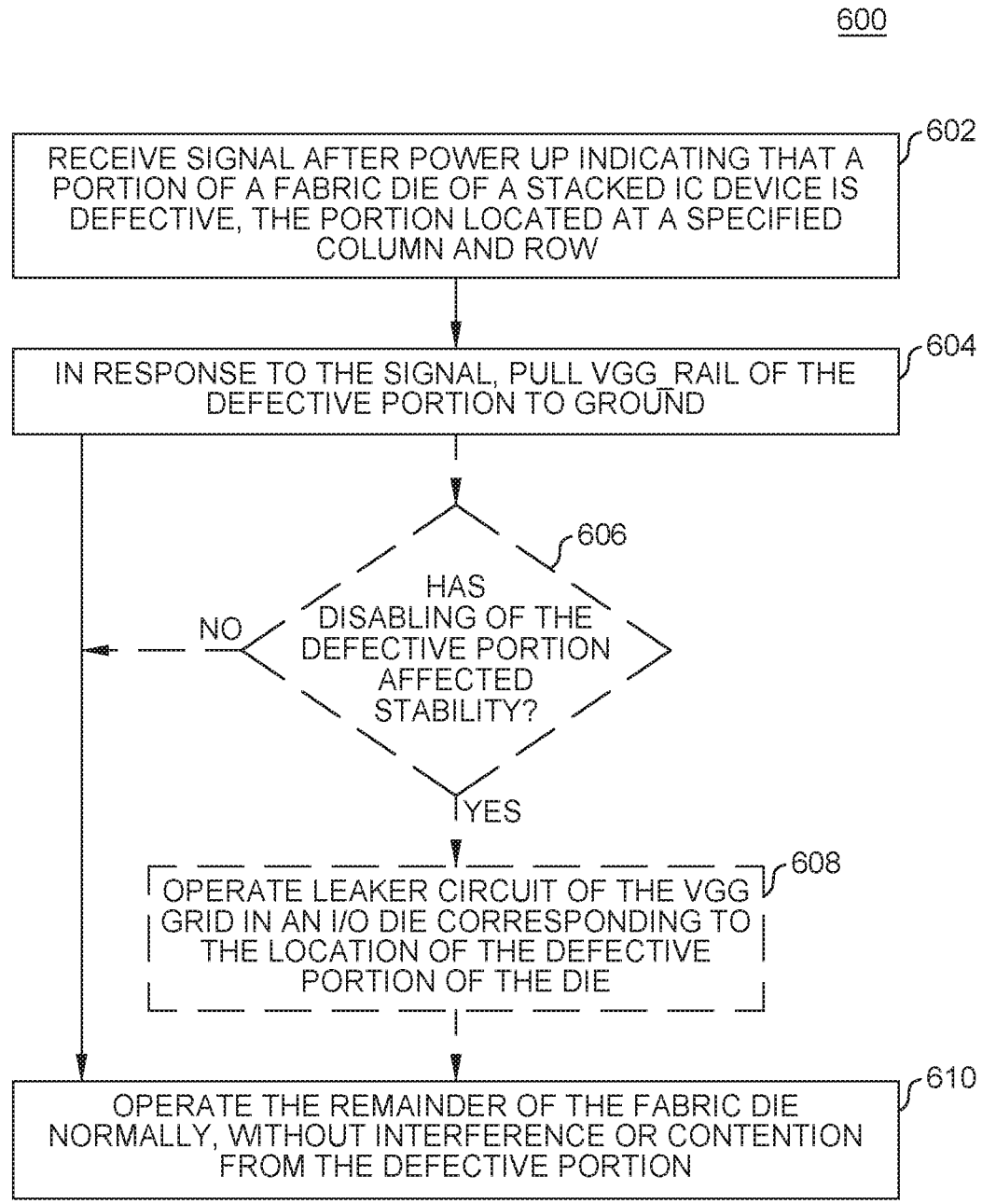
FIG. 6 is a flow chart of a method for pulling down the voltage of a defective portion of a fabric die, according to some examples.

FIG. 6 is a flow chart of a method 600 for pulling down the voltage of a defective portion of a fabric die, according to some examples. The method 600 is described below in the context of the power switch circuit shown in FIGS. 1 and 4, as may be implemented in the Vgg power switches 550 shown in the 3D view of FIG. 5 of a stacked IC device. Other examples can be implemented using other stacked IC devices.

Method 600 begins at block 602 where, after power-up of the stacked IC device, a signal is received at a portion of a fabric die of the stacked IC device indicating that the portion is defective. For example, the portion of the fabric die is identified by column and row, as shown in FIG. 5. As noted above, at the time of manufacture, or some time thereafter, fabric dies, or portions of fabric dies, are identified as defective, and thus not useable when the IC device is operated. In one example, information as to which fabric die is, or which portion(s) of a fabric die are, defective is encoded in fuses on the IC device. At power-up logic reads the fuses and generates appropriate signals which are sent to one or more power switches serving the portion(s) of the fabric die that are defective. In one example, the signal is the "en_defective 101" signal shown in FIG. 1, and the "en_defective" signal is received at one or more Vgg power switches 550, as shown in FIG. 5. In one example, the Vgg power switch 550 is the power switch shown in FIG. 1.

From block 602, method 600 proceeds to block 604. At block 604, in response to the received signal, the power switch pulls the Vgg rail supplying power to the defective portion to ground. For example, with reference to FIG. 4, in the upper left portion of the figure, there is shown a portion of fabric DIE-4 410. The indicated portion has a power switch 411 that supplies Vgg for the MC 412 at that portion of the fourth fabric die 410. If the input "en_defective_4" to power switch 411 is high (as shown in the bottom row of the table of FIG. 2), then power switch 411 pulls down Vgg to ground, as described above in connection with FIG. 1. As a result the Vgg output to MC 412 is ground, and MC 412 uses effectively no current.

From block 604, method 600 proceeds to optional query block 606, used in some examples. At optional query block 606, it is determined if disabling a defective portion of the fabric die as per block 604 has negatively affected stability. If "No" at optional query block 606, then method 600 proceeds to block 610. However, if the response is "Yes" at query block 606, then method 600 proceeds to optional block 608, where, to provide further stability, a leaker circuit is engaged. In one example, the leaker circuit is Vgg leakers 442, 446 of FIG. 4.

From optional block 608, if it is used, or from block 604 if optional query blocks 606 and 608 are not used, method 600 proceeds to block 610, where the remainder of the die is operated normally, without interference or contention from the now shut down defective memory cell or cells. Method 600 terminates at block 608.

It is noted that, in some examples, providing each portion (e.g., a block) of a fabric die, with a regulated voltage via a power switch, which is a thin-ox device, and only placing Vgg generation circuitry, which is implemented in a thick-ox design, facilitates significant area savings on the fabric dies. Moreover, in some examples, by further providing leakage circuitry adjacent to, or, for example, integrated in, each Vgg generation circuit of the IO die, to replicate the MC leakage for defective fabric dice above it, significant improvements in stability may be achieved. Finally, by controlled loading in Vgg and center tap based trim provided only on the IO die, improved yield is facilitated.

Thus, in some examples, locations of defective portions of fabric dies of a stacked IC device, for example, an AoA device, are encoded in e-fuses on the stacked IC device. In one example, when the stacked IC device is powered on, a signal indicating a defective portion of a fabric die is generated from the e-fuses and sent to one or more power switches, respectively provided at defective portions of fabric dies of the stacked IC device. Upon receipt of the defective signal, each power switch pulls an output Vgg rail voltage down to ground, thereby isolating the defective portion of the fabric die. In one example, a leaker circuit is also operated to improve stability of the stacked IC device following disablement of the defective portion. In one example, the remaining portions of each fabric die are respectively operated without interference from, or contention with, the disabled portions.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to specific examples, other and further examples may be devised without departing from the basic scope thereof, and the scope thereof is determined by the claims that follow.

What is claimed is:

1. A method, comprising:
   receiving a signal indicating that a portion of a fabric die of a stacked IC device including at least two fabric dies is defective;
   in response to the signal, pulling a source voltage rail of the defective portion to ground, thereby disabling the portion; and
   operating a remainder of the fabric die without interference from or contention with the disabled portion.

2. The method of claim 1, wherein the signal is received after power-up of the stacked IC device.

3. The method of claim 1, wherein the stacked IC device is an active on active (AoA) device.

4. The method of claim 1, wherein the portion of the fabric die includes a configuration memory cell.

5. The method of claim 1, wherein the signal is received at, and the source voltage rail is pulled down by, a power switch provided in the portion of the fabric die.

6. The method of claim 5, wherein the power switch supplies power to a memory cell (MC) provided in the portion.

7. The method of claim 1, wherein the signal is generated in an IO die of the stacked IC device and transmitted to the fabric die through the stacked IC device.

8. The method of claim 1, further comprising determining, following pulling the source voltage rail of the defective portion to ground, whether the disabling of the defective portion has decreased stability by a predefined metric.

9. The method of claim 8, further comprising, in response to the determination, operating a leaker circuit of a supply voltage grid of the stacked IC device corresponding to two-dimensional location of the defective portion, the leaker circuit configured to replicate, at least in part, memory cell leakage for the defective portion.

10. The method of claim 9, wherein the leaker circuit is provided in an IO die of the stacked IC device, below the defective portion.

11. Apparatus for power regulation, comprising: an input interface, configured to receive a signal indicating whether a portion of a fabric die of a stacked IC device is defective; an output interface, configured to output a regulated supply voltage to a voltage rail (Vgg rail) of the portion of the fabric die; and processing circuitry, coupled to the input interface and to the output interface, configured to, in response to the signal indicating that the portion of the fabric die is defective, output, via the output interface, a ground voltage to the voltage rail.

12. The apparatus of claim 11, wherein the processing circuitry is further connected to both a supply voltage grid (Vgg grid) and a ground terminal of the stacked IC device.

13. The apparatus of claim 12, wherein the processing circuitry is further configured to output, in response to the signal indicating that the portion is functional, the regulated supply voltage to the Vgg rail of the portion, the regulated supply voltage derived from the supply voltage provided by the Vgg grid.

14. The apparatus of claim 11, wherein the Vgg rail supplies power to a memory cell of the portion of the fabric die.

15. The apparatus of claim 11, wherein the stacked IC device comprises a bottom IO die, and two or more fabric dies stacked on top the IO die, and wherein the portion of the fabric die is on one of the two or more fabric dies.

16. The apparatus of claim 15, wherein the stacked IC device comprises a Vgg grid comprising two or more rows, each row comprising two or more conduits providing Vgg from the IO die to each of the two or more fabric dies.

17. A stacked IC device, comprising:
   an IO die;
   at least two fabric dies provided above the IO die; and
   a plurality of vertical conduits, each conduit extending from the IO die to each of the fabric dies and supplying a voltage Vgg to an adjacent region of each fabric die; and
   at each fabric die, at least one power switch coupled to one of the vertical conduits and to the adjacent region of the fabric die,
   wherein each power switch comprises:
      an input interface, configured to receive a signal indicating whether an adjacent portion of the fabric die is defective or functional;
      an output interface, configured to output a regulated supply voltage to a voltage rail (Vgg rail) of the adjacent portion; and
      processing circuitry, coupled to the input interface and to the output interface, configured to, in response to the signal indicating that the adjacent portion is defective, output, via the output interface, a ground voltage to the Vgg rail of the adjacent portion.

18. The stacked IC device of claim 17, wherein, in each power switch, the processing circuitry is further connected to a ground terminal of the adjacent region of the stacked IC device.

19. The stacked IC device of claim 17, wherein in response to the signal indicating that the adjacent portion is functional, the processing circuitry is further configured to output, to the Vgg rail of the adjacent portion, a regulated voltage derived from that of the vertical conduit.

20. The stacked IC device of claim 17, wherein the plurality of conduits includes two or more rows, each row comprising two or more vertical conduits, and wherein the rows are provided at pre-defined regular intervals within the IC device, and within each row the vertical conduits are provided at pre-defined regular intervals.

* * * * *